United States Patent
Xu et al.

(10) Patent No.: US 10,727,268 B1
(45) Date of Patent: Jul. 28, 2020

(54) CMOS IMAGE SENSOR WITH COMPACT PIXEL LAYOUT

(71) Applicant: SmartSens Technology (CAYMAN) Co., Ltd., Grand Cayman (KY)

(72) Inventors: Chen Xu, Shanghai (CN); Zexu Shao, Shanghai (CN); Xin Wang, Shanghai (CN)

(73) Assignee: SmartSens Technology (Cayman) Co., Ltd, Grand Cayman (KY)

( * ) Notice: Subject to any disclaimer, the term of this patent is extended or adjusted under 35 U.S.C. 154(b) by 0 days.

(21) Appl. No.: 16/414,669

(22) Filed: May 16, 2019

(51) Int. Cl.
*H01L 27/146* (2006.01)
*H04N 5/3745* (2011.01)
*H04N 5/355* (2011.01)
*H04N 5/378* (2011.01)

(52) U.S. Cl.
CPC .. *H01L 27/14641* (2013.01); *H01L 27/14603* (2013.01); *H01L 27/14643* (2013.01); *H04N 5/3745* (2013.01); *H04N 5/355* (2013.01); *H04N 5/378* (2013.01)

(58) Field of Classification Search
CPC ......... H01L 27/14603; H01L 27/14609; H01L 27/14641; H01L 27/14643
See application file for complete search history.

(56) References Cited

U.S. PATENT DOCUMENTS

| | | | |
|---|---|---|---|
| 6,731,335 B1 | 5/2004 | Kim et al. | |
| 7,167,200 B1 | 1/2007 | Phal et al. | |
| 7,573,519 B2 | 8/2009 | Phan et al. | |
| 9,596,423 B1 | 3/2017 | Molgaard | |
| 9,686,485 B2 | 6/2017 | Agranov et al. | |
| 2010/0097508 A1* | 4/2010 | Yanagita | H01L 27/14609 348/301 |
| 2011/0133057 A1 | 6/2011 | Olsen | |
| 2012/0212657 A1 | 8/2012 | Mo et al. | |
| 2016/0065868 A1 | 3/2016 | Olsen | |

OTHER PUBLICATIONS

Yannick De Wit, Tomas Geurts; Title: A Low Noise Low Power Global Shutter CMOS Pixel Having Capability and Good Shutter Efficiency; Date: Unknown; pp. 1-4; Pub: Belgium.

* cited by examiner

*Primary Examiner* — Hoai V Pham
(74) *Attorney, Agent, or Firm* — Eric Karich; Karich & Associates

(57) ABSTRACT

An image sensor array of shared pixel units fabricated by a CMOS technology, wherein each pixel unit includes a plurality of photodiodes and respective transfer transistors and floating drains whose layout constitutes mirror images. The plurality of photodiodes each share a single reset transistor and source follower amplifier transistor wherein the shared floating diode is spaced at the minimum distance, from a gate electrode of the source follower transistor as is allowed by the CMOS fabrication technology chosen to manufacture the image sensor array.

5 Claims, 8 Drawing Sheets

CMOS IMAGE SENSOR WITH COMPACT PIXEL LAYOUT

BACKGROUND OF THE INVENTION

Field of the Invention

This invention relates generally to image sensors, and more particularly to CMOS image sensors. The present invention provides an image sensor array and circuit design employing a compact pixel unit layout to enable very large pixel arrays. An image sensor comprising the invented circuit design may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device, to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has led to pixel arrays becoming much larger in the number of pixels, but not much larger in overall area due to the use of narrower interconnect lines and smaller electronic components in the pixels and in the readout and control circuits. Miniaturization has also come with the loss of pixel photosensitivity and dynamic range which require new approaches in order to mitigate. Pixel units in which two or more photodiodes may share a common readout circuit allowing the net area per pixel to be reduced. New approaches to image sensor circuit design and layout are required to further enable the employment of large imaging arrays.

An advanced dynamic range enhancement technique may employ a well capacity adjusting scheme. In this scheme, the well capacity is increased one or more times during the time period in which the photodiode charge is being transferred to the floating diode. The employment of such a dynamic range enhancement scheme in the context of an image sensor pixel is included in an alternative embodiment of the invention. The dynamic range enhancement scheme employed in the alternate embodiments of the invention involves constructing a well capacity adjusting circuit by adding a capacitor and a capacitor control transistor in an electrically parallel configuration with the floating drain on the pixel cell. By coupling the additional capacitor to the floating drain the photodiode charge is transferred to a larger capacitance resulting in a lower conversion gain and the ability to accommodate more charge before saturation. This ability is employed while scenes with high light intensity are being imaged and not while scenes with normal and low light intensity are being imaged.

An additional way to affect conversion gain is to reduce the net floating drain capacitance by reducing the diode capacitance by minimizing the area of the floating drain and also reducing the interconnect capacitance associated with the connection between the floating drain and the gate electrode of the source follower amplifier transistor by choosing a layout design of the pixel that minimizes the separation between the floating drain and the gate electrode of the SF transistor.

The present invention fulfills these needs and provides further advantages as described in the following summary.

SUMMARY OF THE INVENTION

The present invention teaches certain benefits in construction and use which give rise to the objectives described below.

An image sensor comprises a pixel cell array comprising a plurality of rows and columns of pixels wherein the readout of the data placed on each column is converted by an analog to data (ADC) circuit element into a binary coded datum held in a column memory circuit element. The invented pixel cell array employs a compact layout allowing increased compactness and conversion gain performance.

A primary objective of the present invention is to provide an image sensor pixel having advantages not taught by the prior art.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an image sensor pixel cell array employing a compact layout allowing increased compactness and performance.

Various embodiments of the image sensor pixel cell are disclosed herein. In the following description, numerous specific details are set forth in order to provide a thorough understanding of the present invention. One skilled in the relevant art will recognize however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in a front surface of a substrate. A dielectric stack that includes alternating layers of metal routing layers and conductive via layers may be formed on the front surface of a substrate.

Throughout the specification and claims, the following terms take the meanings explicitly associated herein, unless the context clearly dictates otherwise. The terms "coupled" and "connected," which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Should the invention involve a stacked chip arrangement, the front sides of two chips may be directly connected since the electrical interconnects on each chip will most commonly be formed on the front sides of each chip, or the front side of one chip may be directly connected to the back side of the second, which may employ through chip interconnects. Although circuit elements may be fabricated on the back side, when reference is made to certain circuit elements residing within or formed in a substrate, this is generally accepted to mean the circuits reside on the front side of the substrate.

Figure 1:
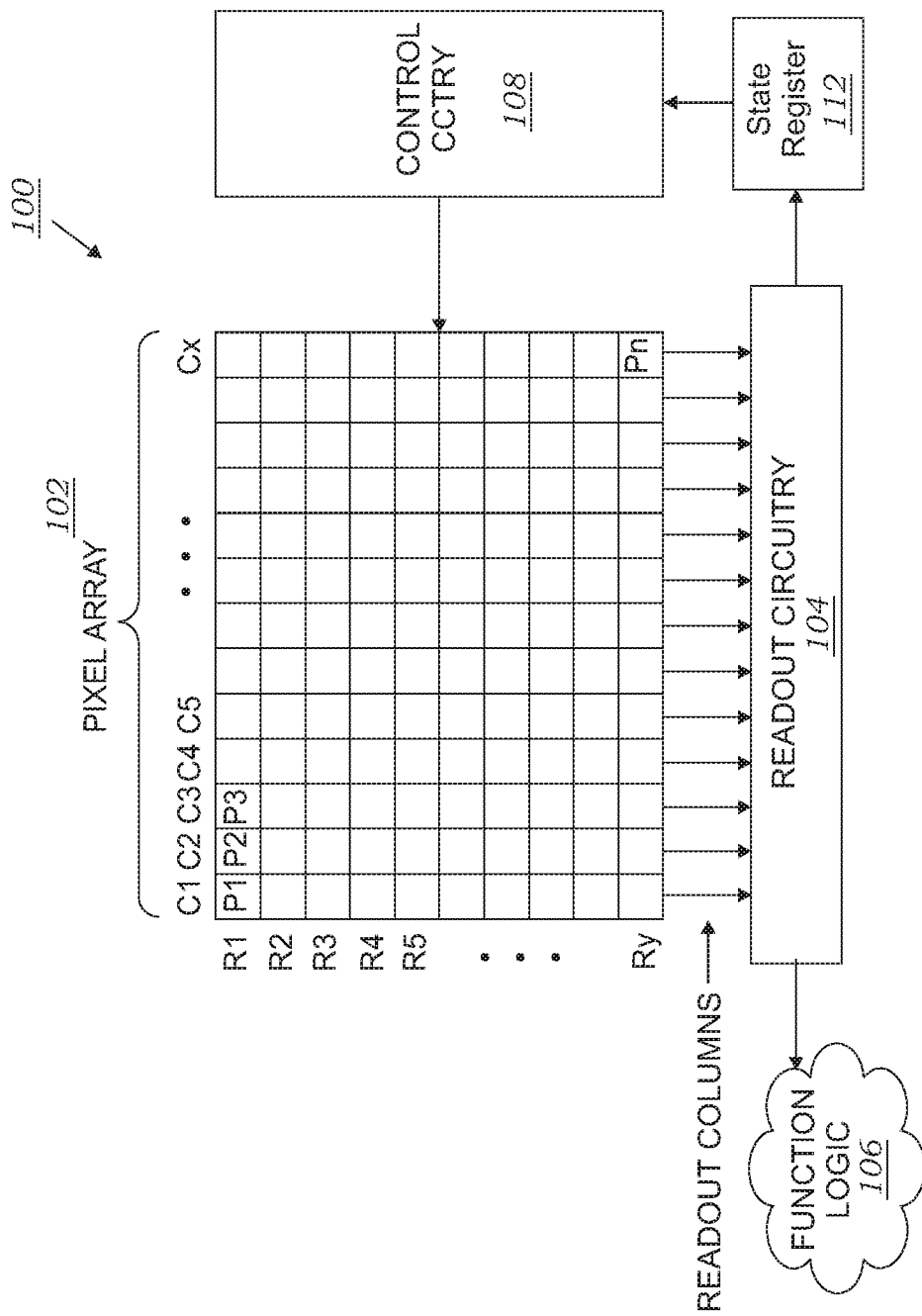
FIG. 1 is a diagram illustrating an imaging system including a pixel cell array having image sensor pixel cells included in an integrated circuit system, according to one embodiment of the present invention.

FIG. 1 is a diagram illustrating one example of an imaging system 100 including an example pixel array 102 having a plurality of image sensor pixels included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 112. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 using a readout mode specified by state register 112 and then transferred to function logic 106. In various examples, readout circuitry 104 may include amplification circuitry, analog-to-digital (ADC) conversion circuitry, or otherwise. State register 112 may include a digitally programmed selection system to determine whether readout mode is by rolling shutter or global shutter. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated), or may readout the image data using a variety of other techniques (not illustrated), such as a serial readout or a full parallel readout of all pixels simultaneously. In one example, control circuitry 108 is coupled to pixel array 102 to control operational characteristics of pixel array 102. Some aspects of the operation of control circuitry 108 may be determined by settings present in state register 112. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
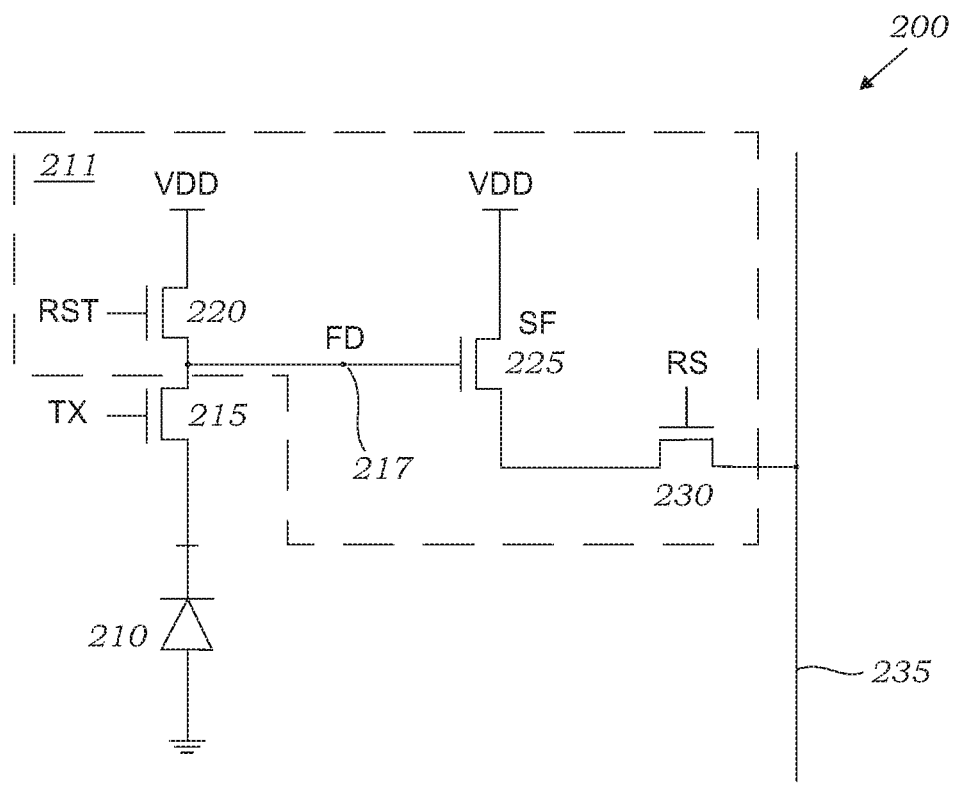
FIG. 2 is an electrical schematic that illustrates a prior art image sensor pixel cell with rolling shutter readout.

FIG. 2 is an electrical schematic that illustrates one example of an image sensor pixel cell 200 with rolling shutter readout found in the prior art. This figure and example pixel are provided to simplify explanation of pixel operation in anticipation of a description of an example of the present invention. Each sensor pixel 200 includes a photodiode 210 (e.g., photosensitive element) and pixel support circuitry 211 as shown. Photodiode 210 may be a "pinned" photodiode as is commonly present in CMOS image sensors. Photodiode 210 may be disposed on a sensor chip of a stacked die system, while pixel support circuitry 211 may be disposed on a separate circuit chip. In the example of FIG. 2, pixel support circuitry 211 includes a reset transistor 220, source follower (SF) amplifier transistor 225, and row select transistor 230 on a circuit chip coupled to a transfer transistor 215 and photodiode 210 on a sensor chip of a stacked die system as shown. An amplifier transistor in a source follower configuration is one in which the signal is input on the gate electrode and taken out on the source electrode. In another example, not shown, pixel support circuitry includes row select transistor 230 on a circuit chip coupled to a reset transistor 220, source follower (SF) transistor 225, transfer transistor 215 and photodiode 210 on a sensor chip of a stacked die system. During operation, photosensitive element 210 photo-generates charge in response to incident light during an exposure period. Transfer transistor 215 is coupled to receive a transfer signal TX, which causes transfer transistor 215 to transfer the charge accumulated in photodiode 210 to floating diffusion (FD) node 217. Floating diffusion 217 is in effect the drain of the transfer transistor 215 while the photodiode 210 is the source of transfer transistor 215. In one embodiment, transfer transistor 215 is a metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235. in response to a row select signal RS. Photodiode 210 and floating diffusion node 217 are reset by temporarily asserting or enabling the reset signal RST and transfer signal TX. The accumulation period or accumulating window (e.g., exposure period) begins when the transfer signal TX is disabled, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is disabled, which turns off the reset transistor 220 and isolates floating diffusion FD node 217 from VDD. The transfer signal TX is then enabled to couple photodiode 210 to floating diffusion node 217. The charge is transferred from photodiode 210 to the floating diffusion FD node 217 through transfer transistor 215 which causes the voltage of floating diffusion FD node 217 to drop by an amount proportional to photo-generated electrons accumulated on photodiode 210 during the exposure period. The accumulation period or exposure window actually ends when the transfer transistor 215 is disabled, since the photodiode 210 is actually still accumulating charge while the transfer transistor 215 is enabled and transferring charge to the floating diffusion 217.

An important design metric in image sensors is dynamic range, which is defined as the logarithmic ratio between the largest non-saturating photocurrent and the smallest detectable photocurrent. For a sensor with a fixed saturation charge, also referred to as full well capacity, saturation limits the highest signal. Generally, the smallest detectable photocurrent is dominated by reset sampling noise of the photodiode 210 and the floating diffusion 217. Efforts to reduce the impact of reset sampling noise on dynamic range have relied on correlated double sampling (CDS). CDS is a technique of taking two samples of a signal out of the pixel and subtracting the first from the second to remove reset sampling noise. Generally, the sampling is performed once immediately following reset of the photodiode 210 and floating diffusion 217 and once after the photodiode 210 has been allowed to accumulate charge and transfer it to the floating diffusion 217. The subtraction is typically performed in peripheral circuitry outside of the pixel 200 and may increase conventional image sensor area although it may not increase pixel area. An image sensor utilizing a rolling shutter readout mode may incorporate CDS with only added peripheral circuit elements and no additional circuit elements in the pixel 200. An image sensor utilizing global shutter, however, may require multiple capacitors and transistors inside the pixel 200 which decreases the fill factor. It is advantageous to maintain reduced fill factor by partitioning the additional components required for CDS onto a circuit chip separate from and stacked on top of a sensor chip.

Figure 3:
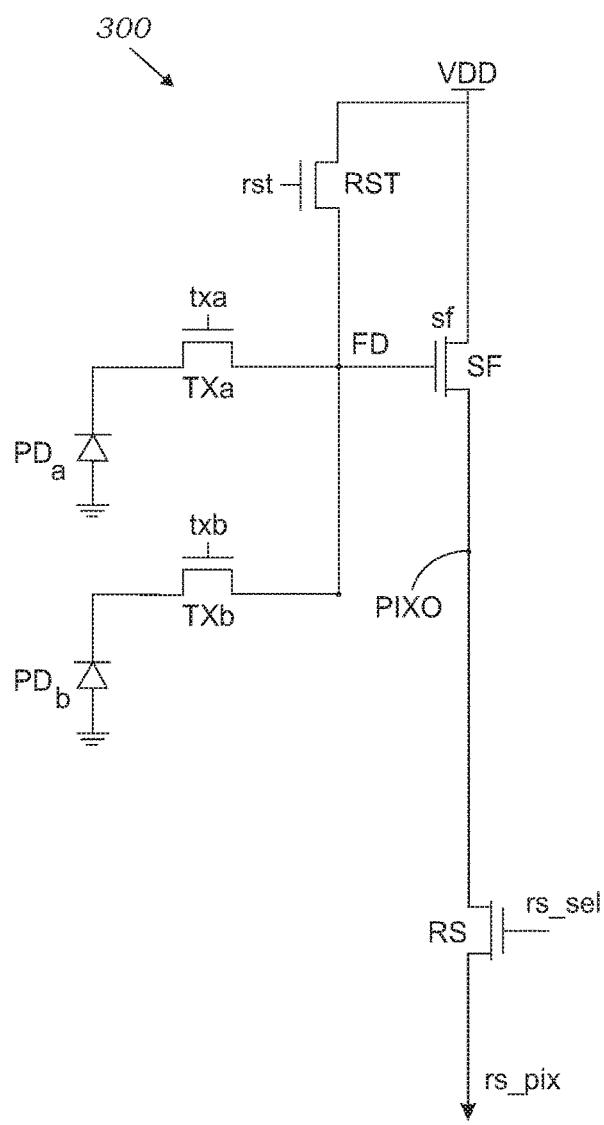
FIG. 3 is an electrical schematic diagram of pixel unit in accordance with a first embodiment of the invention.
Figure 5:
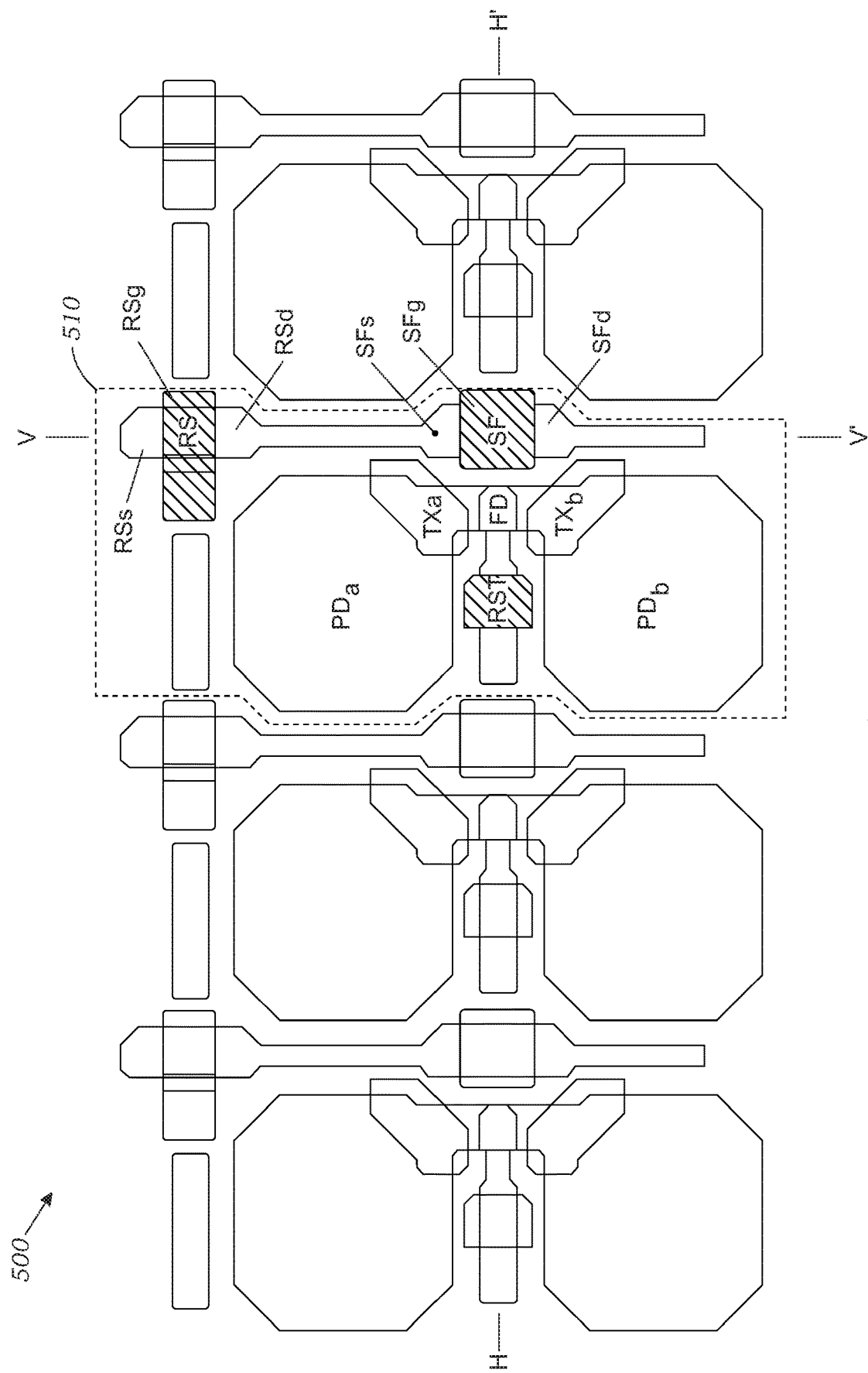
FIG. 5 illustrates a portion of an image sensor array and pixel units whose layout is in accordance with the first embodiment of the invention.

FIG. 3 is an electrical schematic diagram of dual pixel unit 300 whose layout is illustrated in FIG. 5 in accordance with a first embodiment of the invention. The electrical schematic diagram shown in FIG. 3 more clearly illustrates the electrical connections between the electrical components depicted in the layout illustrated in FIG. 5. The component names are common in both figures and will be used in the description of the operation of the dual pixel unit 300. FIG. 3 depicts a set of two transfer transistors (TXa, TXb), each coupled to respective photodiodes (PDa, PDb) and coupled to and sharing a floating drain (FD) for accumulating and transferring an image charge in response to light incident upon the photodiodes. Also residing on pixel unit 300 are a reset transistor (RST) and an amplifier transistor (SF) for converting the image charge to an image signal (PIXO) for coupling out of pixel unit 300. A power supply provides voltage VDD to both reset transistor RST and source follower transistor SF. In order to read out image signal PIXO in rolling shutter mode only row select transistor RS is required to transfer read signal rs_pix to off-pixel readout circuits.

Figure 4:
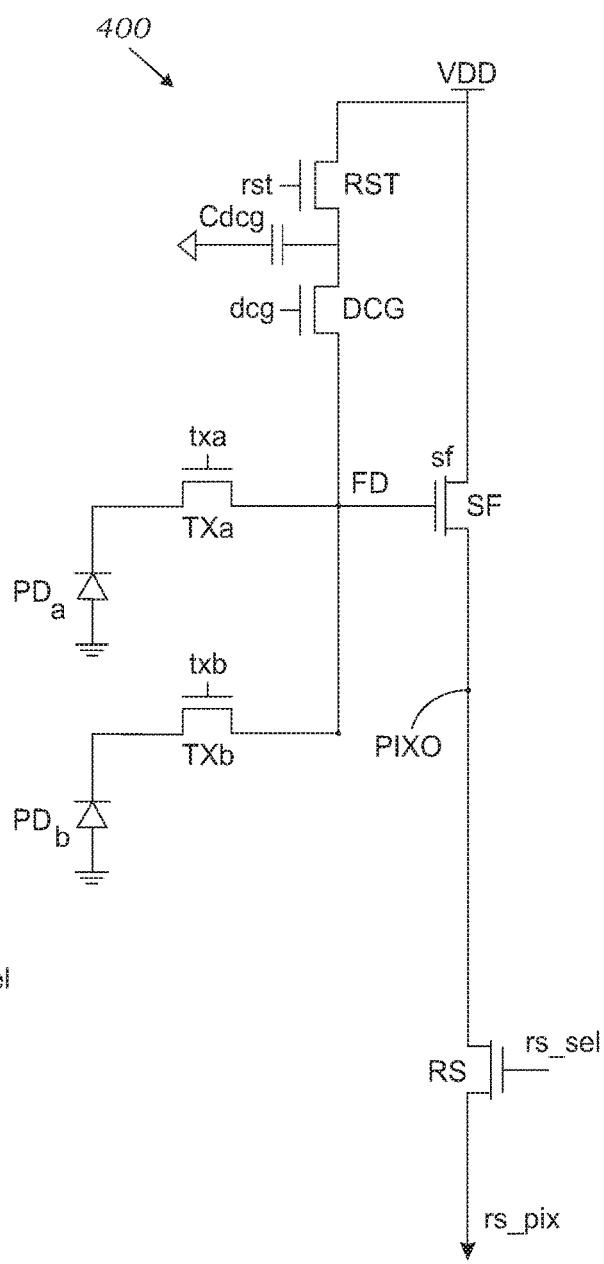
FIG. 4 is an electrical schematic diagram of a pixel unit in accordance with a second embodiment of the invention.
Figure 6:
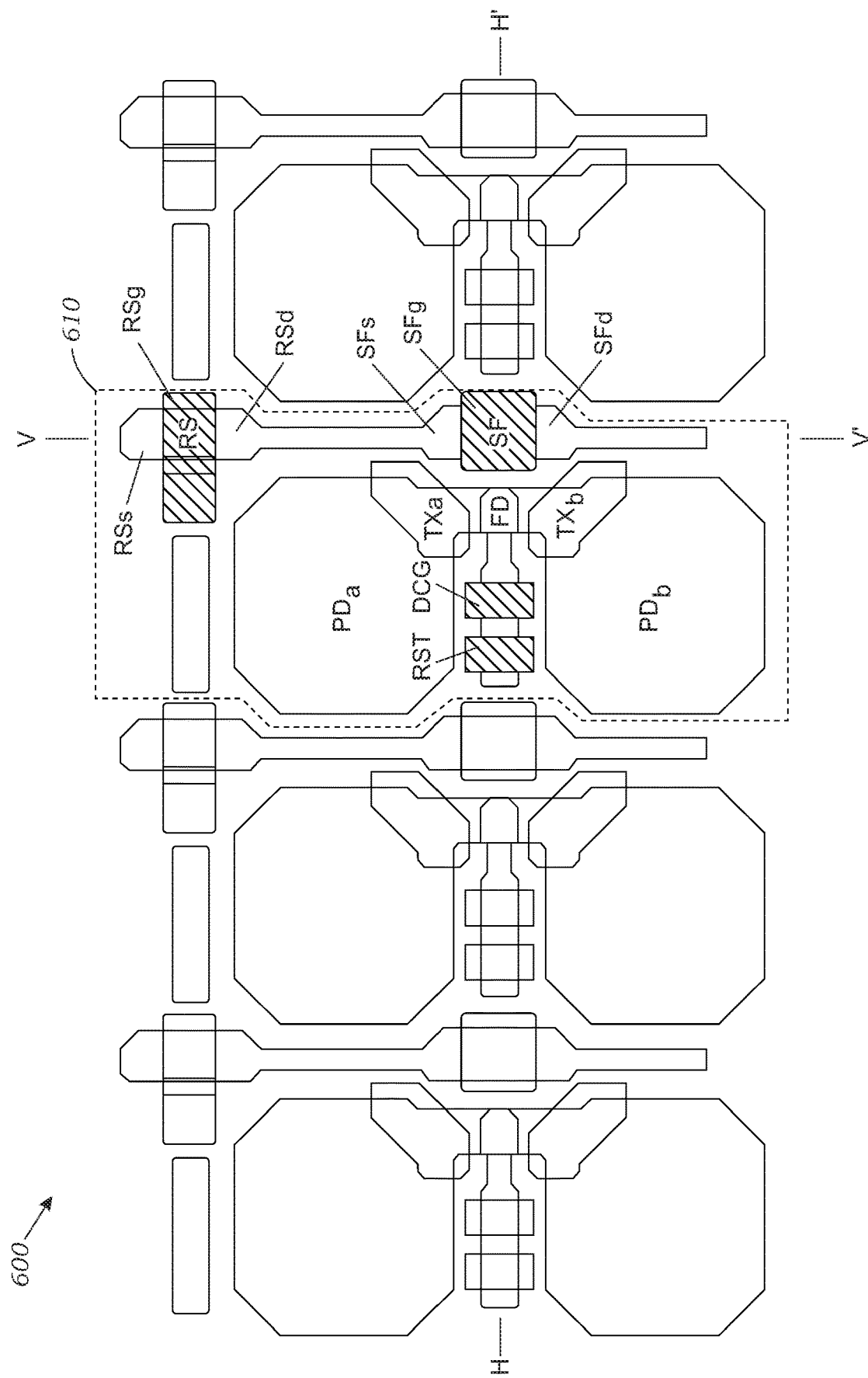
FIG. 6 illustrates a portion of an image sensor array and pixel units whose layout is in accordance with the second embodiment of the invention.

FIG. 4 is an electrical schematic diagram of dual pixel unit 400 whose layout is illustrated in FIG. 6 in accordance with a second embodiment of the invention. The electrical schematic diagram shown in FIG. 4 more clearly illustrates the electrical connections between the electrical components depicted in the layout illustrated in FIG. 6. The component names are common in FIGS. 3, 4, 5, and 6, and will be used in the description of the operation of the pixel unit. FIG. 4 illustrates a pixel unit 400 like that illustrated in FIG. 3 with the addition of a signal dynamic range, enhancing feature based on modifying conversion gain. Pixel unit 400 includes Double Conversion Gain capability as provided by dynamic range enhancement capacitor Cdcg and capacitor control transistor DCG. By switching in capacitor Cdcg through the action of capacitor control transistor DCG the pixel unit conversion gain is modified to accommodate higher or lower illumination incident of the photodiodes leading to increased dynamic range.

FIG. 5 illustrates a layout of a portion of an image sensor pixel array 500 comprising dual pixel units 510 whose layout is in accordance with a first embodiment of the invention. The layout of pixel unit 510 shows an arrangement of two photodiodes PDa and PDb with their respective transfer transistors TXa and TXb. Both transfer transistors couple to and share a common floating drain FD. The two photodiodes and their respective transfer transistors and their respective portions of their shared floating drain FD are shown to be mirror images of each other about the horizontal line axis H H'. In addition, along the horizontal line H H' are located a reset transistor RST and a source follower amplifier transistor SF. Horizontal line axis H H' bisects transistor RST and the gate electrode SFg of transistor SF so that their upper portions and lower portions are mirror images. Reset transistor RST and floating drain FD are connected by a doped Silicon pathway. FIG. 5 also illustrates a drain region SFd of transistor SF and a source region SFs of transistor SF, as well as a drain region RSd of transistor RS and a source region RSs of transistor RS. Transistors RS and SF are shown to have their respective source and drain regions lie along a vertical line V V' wherein the vertical line is perpendicular to horizontal line H H'. Row select transistor RS is shown to occupy a layout location at the upper of the two pixel unit corner locations lying along a vertical line running perpendicular to the horizontal mirror axis and through the source follower transistor.

A key element of the first embodiment of the invention is that floating drain FD is separated from gate electrode SFg of transistor SF by the minimum distance allowed by the design rules of the CMOS fabrication technology employed to fabricate the image sensor array. This minimum separation allows for the minimization of interconnect capacitance due to an interconnect lead that may connect FD to gate electrode SFg and in so doing also minimize the conversion gain to enhance the dynamic range performance of the pixel unit. The spacing between the shared floating diode and the gate electrode of the source, follower transistor may be chosen from the range 0.05 micrometers to 0.25 micrometers. The layout illustrated in FIG. 5 also improves array compactness by sharing floating drain FD and transistors RST, SF and RS among two photodiodes.

Typically the sizes and placements of the photodiodes within pixel cell array 500 are chosen such that an array of dual pixel units 510 will result in all of the photodiodes of the assembled array falling on a uniform grid. In the instance dual pixel units 510 are employed to form a color image sensor, light filters of various colors may be placed at each photodiode location within the incident light path. A commonly known two-by-two arrangement of light filters is a Bayer filter pattern which consists of a red, a blue, and two green filters (RGrGbB).

FIG. 6 illustrates a layout of a portion of an image sensor pixel array 600 comprising dual pixel units 610 whose layout is in accordance with the second embodiment of the invention. The layout of pixel unit 610 shows an arrangement of two photodiodes PDa and PDb with their respective transfer transistors TXa and TXb. Both transfer transistors couple to and share a common floating drain FD. The two photodiodes and their respective transfer transistors and their respective portions of their shared floating drain FD are shown to be mirror images of each other about the horizontal line axis H H'. In addition, along the horizontal line H H' is located a reset transistor RST, a capacitor control transistor DCG, and a source follower amplifier transistor SF. Horizontal line axis H H' bisects transistors RST, DCG and the gate electrode SFg of transistor SF so that their upper portions and lower portions are mirror images. Reset transistor RST and capacitor control transistor DCG are connected by a doped Silicon pathway. Capacitor control transistor DCG and floating drain FD may also be connected by a doped Silicon pathway. FIG. 6 also illustrates a drain region SFd of transistor SF and a source region of transistor SF as well as a drain region Rid of transistor RS and a source region RSs of transistor RS. Transistors RS and SF are shown to have their respective source and drain regions lie along a vertical line V V' wherein the vertical line is perpendicular to horizontal line H H'.

A key element of the second embodiment of the invention is that floating drain FD is separated from gate electrode SFg of transistor SF by the minimum distance allowed by the design rules of the CMOS fabrication technology employed to fabricate the image sensor array. This minimum separation allows for the minimization of interconnect capacitance due to an interconnect lead that may connect FD to gate electrode SFg and in so doing also minimize the conversion gain to enhance the dynamic range performance of the pixel unit. The spacing between the shared floating diode and the gate electrode of the source follower transistor may be chosen from the range 0.05 micrometers to 0.25 micrometers. The layout illustrated in FIG. 6 also improves array compactness by sharing floating drain FD and transistors RST, DCG, SF and RS among two photodiodes.

Figure 7:
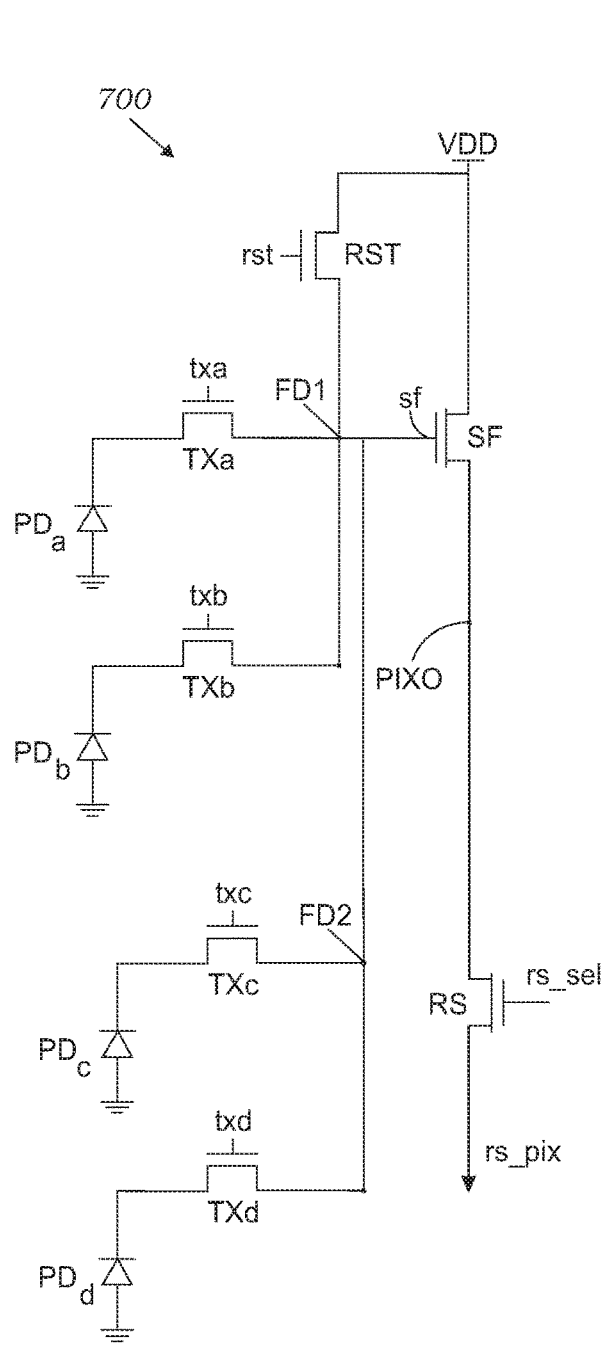
FIG. 7 is an electrical schematic diagram of pixel unit in accordance with a third embodiment of the invention.
Figure 9:
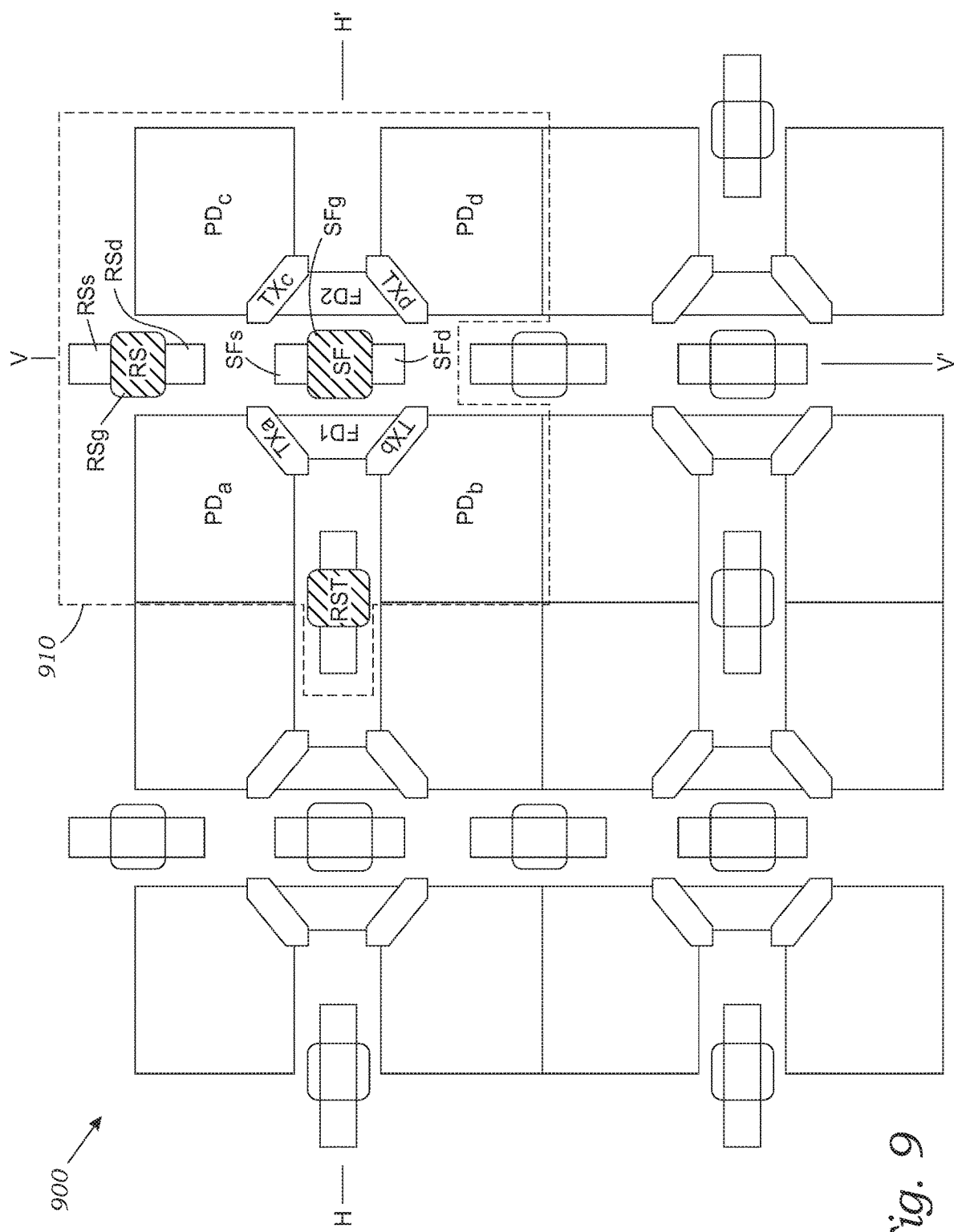
FIG. 9 illustrates a portion of an image sensor array and pixel units whose layout is in accordance with the third embodiment of the invention.

FIG. 7 is an electrical schematic diagram of dual pixel unit 700 whose layout is illustrated in FIG. 9 in accordance with a third embodiment of the invention. The electrical schematic diagram shown in FIG. 7 more clearly illustrates the electrical connections between the electrical components depicted in the layout illustrated in FIG. 9. The component names are common in both figures and will be used in the description of the operation of the pixel unit. FIG. 7 depicts a set of two pairs of transfer transistors (TXa and TXb, TXc and TXd), each pair of transistors coupled to respective photodiodes (PDa and PDb, PDc and PDd). Each pair of transfer transistors are also coupled to and sharing a floating drain (FD1 and FD2) for accumulating and transferring an image charge in response to light incident upon the photodiodes. Also residing on pixel unit 700 are a reset transistor (RST) and an amplifier transistor (SF) for converting the image charge to an image signal (PIXO) for coupling out of pixel unit 700. A power supply provides voltage VDD to both reset transistor RST and source follower transistor SF. In order to read out image signal PIXO in rolling shutter mode, only row select transistor RS is required to transfer read signal rs_pix to off-pixel readout circuits.

Figure 8:
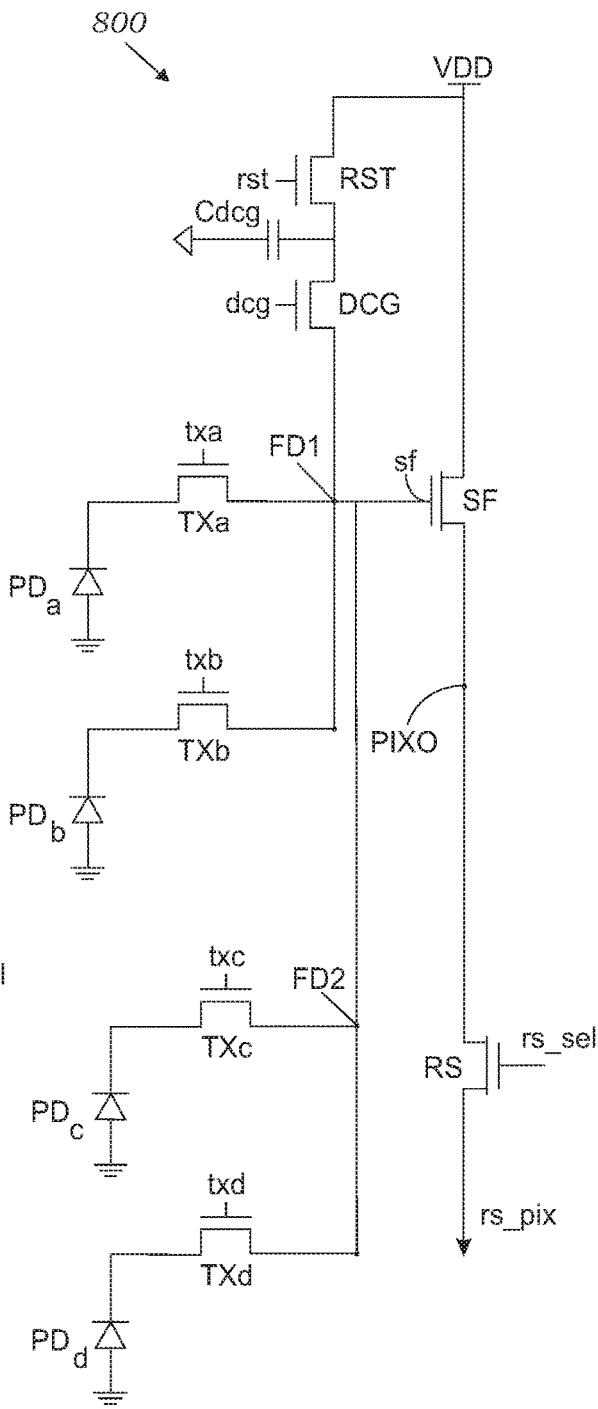
FIG. 8 is an electrical schematic diagram of a pixel unit in accordance with a fourth embodiment of the invention.
Figure 10:
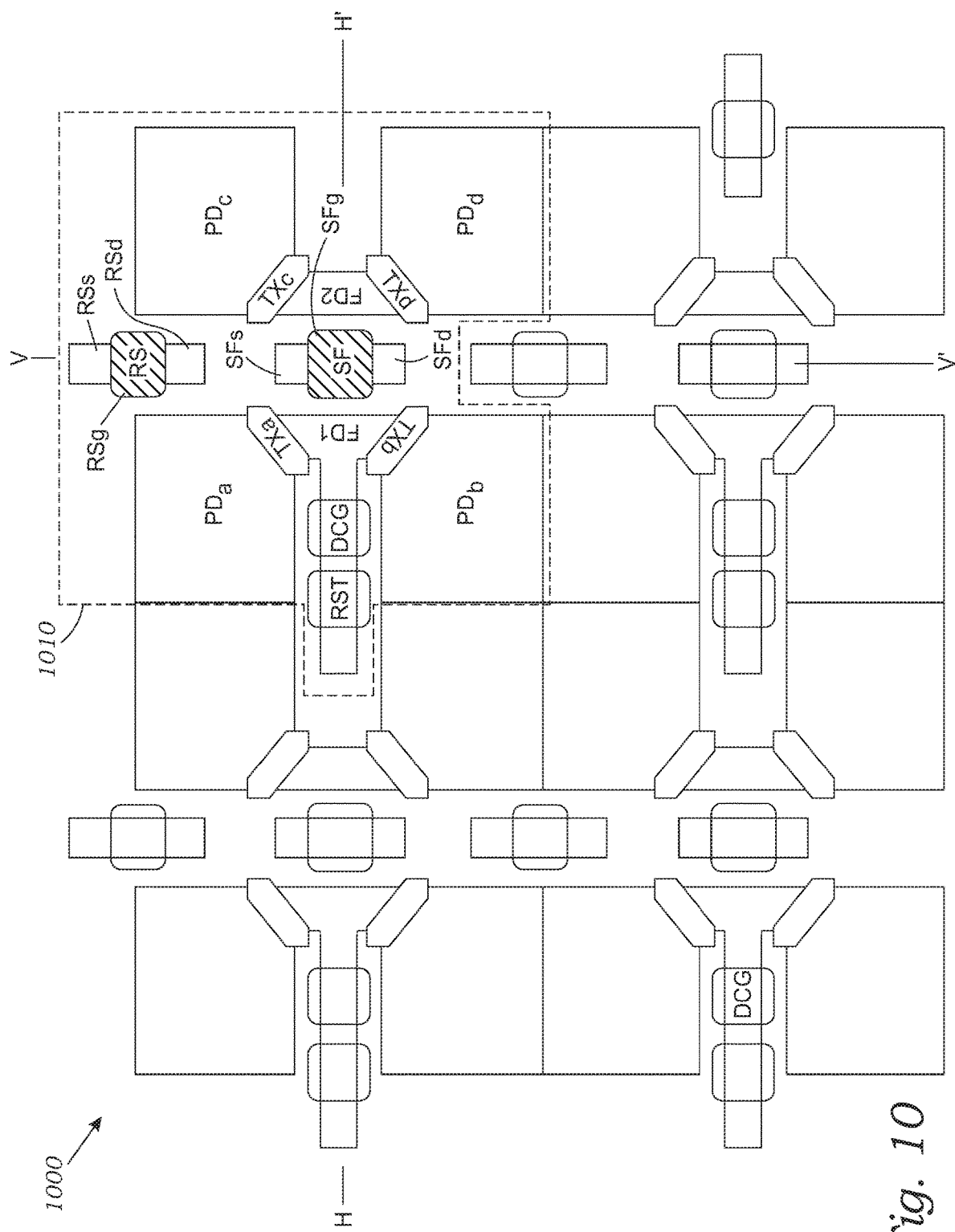
FIG. 10 illustrates a portion of an image sensor array and pixel units whose layout is in accordance with the fourth embodiment of the invention.

FIG. 8 is an electrical schematic diagram of dual pixel unit 800 whose layout is illustrated in FIG. 10 in accordance with a fourth embodiment of the invention. The electrical schematic diagram shown in FIG. 8 more clearly illustrates the electrical connections between the electrical components depicted in the layout illustrated in FIG. 10. The component names are common in FIGS. 7, 8, 9, and 10, and will be used in the description of the operation of the pixel unit. FIG. 8 illustrates a pixel unit like that illustrated in FIG. 7 with the addition of a signal dynamic range enhancing feature based on modifying conversion gain. Pixel unit 800 includes Double Conversion Gain capability as provided by dynamic range enhancement capacitor Cdcg and capacitor control transistor DCG. By switching in capacitor Cdcg, through the action of capacitor control transistor DCG the pixel unit conversion gain is modified to accommodate higher or lower illumination incident of the photodiodes leading to increased dynamic range.

FIG. 9 illustrates a layout of a portion of an image sensor pixel array 900 comprising quad (four) pixel units 910 whose layout is in accordance with the third embodiment of the invention. The layout of pixel unit 910 shows an arrangement of a first pair of transfer transistors (TXa and TXb) and a second pair of transfer transistors (TXc and TXd), with each pair of transistors coupled to respective photodiodes (PDa and PDb, PDc and PDd). The first pair of transfer transistors are coupled to and share a floating drain FD1 and the second pair of transfer transistors are coupled to and share a floating drain FD2, both for accumulating and transferring an image charge in response to light incident upon the photodiodes. Also residing on pixel unit 910 area reset transistor (RST) and an amplifier transistor (SF) for converting the image charge to an image signal (PIXO) for coupling out of pixel unit 910. The two photodiodes PDa and PDb and their respective transfer transistors TXa and TXb and their respective portions of their shared floating drain FD1 are shown to be mirror images of each other about the horizontal line axis H H'. The two photodiodes PDc and PDd and their respective transfer transistors TXc and TXd and their respective portions of their shared floating drain FD2 are shown to be mirror images of each other about the horizontal line axis H H'. In addition, along the horizontal line H H' is located the reset transistor RST and the source follower amplifier transistor SF. Horizontal line axis H H' bisects transistor RST and the gate electrode SFg of transistor SF so that their upper portions and lower portions are mirror images. Although not illustrated, reset transistor RST and floating drain FD1 may be connected by a doped Silicon pathway. FIG. 9 also illustrates a drain region SFd of transistor SF and a source region SFg of transistor SF as well as a drain region RSd of transistor RS and a source region RSs of transistor RS. Transistors RS and SF are shown to have their respective source and drain regions lie along a vertical line V V' wherein the vertical line is perpendicular to horizontal line H H'. FIG. 9 additionally illustrates that the layout of the first pair of photodiodes and transfer transistors is a minor image of the layout of the second pair of photodiodes wherein their minor axis is the central vertical median line (of the four photodiodes) running perpendicular to the horizontal mirror axis and through the source follower transistor.

A key element of the third embodiment of the invention is that floating drains FD1 and FD2 are separated from gate electrode SFg of transistor SF by the minimum distance allowed by the design rules of the CMOS fabrication technology employed to fabricate the image sensor array. This minimum separation allows for the minimization of interconnect capacitance due to an interconnect lead that may connect FD1 and FD2 to gate electrode SFg and in so doing also minimize the conversion gain to enhance the dynamic range performance of the pixel unit The spacing between the shared floating diode and the gate electrode of the source follower transistor may be chosen from the range 0.05 micrometers to 0.25 micrometers. The layout illustrated in FIG. 9 also improves array compactness by sharing transistors RST, SF, and RS among four photodiodes.

Typically, the sizes and placements of the photodiodes within pixel cell array 900 are chosen such that an array of quad pixel units 910 will result in all of the quad pixel units of the assembled array falling on a uniform grid. In the instance quad pixel units 910 are employed to form a color image sensor, light filters of various colors may be placed at each photodiode location within the incident light path. A commonly known two-by-two arrangement of light filters is a Bayer filter pattern which consists of a red, a blue, and two green filters (RGrGbB).

The quad pixel unit arrangement illustrated in FIG. 9 may assign color filter R to photodiode PDa, color filter Gb to photodiode PDb, color filter Gr to photodiode PDc, and color filter B to photodiode PDd. An advantage of the fourth embodiment of the invention as illustrated in FIG. 9 is that the sensitivity of the two green filtered photodiodes is more closely matched as a result of the invented layout.

FIG. 10 illustrates a layout of a portion of an image sensor pixel array 1000 comprising quad (four) pixel units 1010 whose layout is in accordance with a fourth embodiment of the invention. The layout of pixel unit 1010 shows an arrangement of a first pair of transfer transistors (TXa and TXb) and a second pair of transfer transistors (TXc and TXd), with each pair of transistors coupled to respective photodiodes (PDa and PDb, PDc and PDd). The first pair of transfer transistors are coupled to and share a floating drain FD1 and the second pair of transfer transistors are coupled to and share a floating drain FD2, both for accumulating and transferring an image charge in response to light incident upon the photodiodes. Also residing on pixel unit 910 are a reset transistor (RST) and an amplifier transistor (SF) for converting the image charge to an image signal (PIXO) for coupling out of pixel unit 910. The two photodiodes PDa and PDb and their respective transfer transistors TXa and TXb and their respective portions of their shared floating drain FD1 are shown to be mirror images of each other about the horizontal line axis H H'. The two photodiodes PDc and PDd and their respective transfer transistors TXc and TXd and their respective portions of their shared floating drain FD2 are shown to be mirror images of each other about the horizontal line axis H H'. In addition, along the horizontal line H H' is located the reset transistor RST, a capacitor control transistor DCG, and the source follower amplifier transistor SF. Horizontal line axis H H' bisects transistor RST. DCG, and the gate electrode SFg of transistor SF so that their upper portions and lower portions are mirror images. Reset transistor RST and capacitor control transistor DCG are connected by a doped Silicon pathway. Capacitor control transistor DCG and floating drain FD may also be connected by a doped Silicon pathway. FIG. 10 also illustrates a drain region SFd of transistor SF and a source region SFg of transistor SF as well as a drain region RSd of transistor RS and a source region RSs of transistor RS. Transistors RS and SF are shown to have their respective source and drain regions lie along a vertical line V V' wherein the vertical line is perpendicular to horizontal line H H'. FIG. 10 additionally illustrates that the layout of the first pair of photodiodes and transfer transistors is a mirror image of the layout of the second pair photodiodes wherein their minor axis is the central vertical median line (of the four photodiodes) running perpendicular to the horizontal mirror axis and through the source follower transistor.

A key element of the fourth embodiment of the invention is that floating drains FD1 and FD2 are separated from gate electrode SFg of transistor SF by the minimum distance allowed by the design rules of the CMOS fabrication technology employed to fabricate the image sensor array. This minimum separation allows for the minimization of interconnect capacitance due to an interconnect lead that may connect FD1 and FD2 to gate electrode SFg and in so doing also minimize the conversion gain to enhance the dynamic range performance of the pixel unit. The spacing between the shared floating diode and the gate electrode of the source follower transistor may be chosen from the range 0.05 micrometers to 0.25 micrometers. The layout illustrated in FIG. 10 also improves array compactness by sharing transistors RST, SF, and RS among four photodiodes.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An image sensor array of shared pixel units fabricated by a CMOS technology providing improved compactness and performance, each pixel unit comprising:
   a first and second photodiode, each having associated adjacent first and second transfer transistors;
   a first portion of a floating diode coupled to and adjacent to the first transfer transistor and a second portion of a floating diode coupled to and adjacent to the second transfer transistor;
   a first portion of a reset transistor and a second portion of a reset transistor;
   a first portion of a source follower amplifier transistor and a second portion of a source follower transistor; wherein the layout of the first photodiode, the first transfer transistor, the first portion of the floating diode, the first portion of the reset transistor and the first portion of the source follower transistor is a mirror image of the layout of the second photodiode, the second transfer transistor, the second portion of the floating diode, the second portion of the reset transistor and the second portion of the source follower transistor; and wherein the first and second portions of the reset transistor form a single reset transistor and the first and second portions of the source follower transistor form a single source follower transistor; and wherein the first and second portions of the floating diode form a single shared floating diode which is spaced at the minimum distance from a gate electrode of the source follower transistor as is allowed by the CMOS fabrication technology chosen to manufacture the image sensor array.

2. The pixel unit of the image sensor array of shared pixel units of claim 1, wherein the spacing between the shared floating diode and the gate electrode of the source follower transistor is chosen from the range 0.05 micrometers to 0.25 micrometers.

3. The pixel unit of the image sensor array of shared pixel units of claim 1, wherein the single reset transistor, the single shared floating drain, and the single source follower transistor are arranged along a horizontal line which constitutes the mirror image axis; and wherein the floating drain is coupled through a doped Silicon pathway on one side to the reset transistor and is spaced at the minimum distance from the gate electrode of the source follower transistor on its opposing side.

4. The pixel unit of the image sensor array of shared pixel units of claim 3, additionally including a row select transistor electrically coupled to the source follower transistor and occupying a layout location at one of the two pixel unit corner locations lying along a vertical line running perpendicular to the horizontal mirror axis and through the source follower transistor.

5. The image sensor array of shared pixel units of claim 1, comprising n rows and m columns of photodiodes wherein each pixel unit spans two rows and one column resulting in the use of n/2 rows and m columns of pixel units to layout the array of shared pixel units.

* * * * *